United States Patent [19]
Merkle

[11] 3,971,062
[45] July 20, 1976

[54] SEMICONDUCTOR ARRANGEMENT

[75] Inventor: Rolf Merkle, Meimsheim, Germany

[73] Assignee: Licentia Patent-Verwaltungs-G.m.b.H., Frankfurt am Main, Germany

[22] Filed: Aug. 20, 1975

[21] Appl. No.: 606,193

Related U.S. Application Data
[63] Continuation of Ser. No. 401,008, Sept. 26, 1973, abandoned.

[30] Foreign Application Priority Data
Sept. 28, 1972 Germany............................ 2247580

[52] U.S. Cl.................................... 357/70; 357/68; 357/71
[51] Int. Cl.².................. H01L 23/48; H01L 29/44; H01L 29/46
[58] Field of Search .................... 357/68, 70, 71, 72

[56] References Cited
UNITED STATES PATENTS

| | | | |
|---|---|---|---|
| 3,588,616 | 6/1971 | Palazzini............................... | 357/70 |
| 3,717,800 | 2/1973 | Thillays et al. ........................ | 357/70 |
| 3,784,883 | 1/1974 | Duncan et al. ........................ | 357/68 |

Primary Examiner—Edward J. Wojciechowicz
Attorney, Agent, or Firm—Spencer & Kaye

[57] ABSTRACT

A semiconductor arrangement comprises metal contacting strip means forming a pattern of connecting parts for receiving semiconductor components or their connecting wires, in which metallized insulating platelets are provided on the metal contacting means and connected to semiconductor components and/or contact points by connecting wires.

7 Claims, 4 Drawing Figures

SEMICONDUCTOR ARRANGEMENT

CROSS REFERENCE TO RELATED APPLICATION

This application is a continuation of appication Ser. No. 401,008, filed Sept. 26th, 1973, now abandoned.

BACKGROUND OF THE INVENTION

The invention relates to a semiconductor arrangement made in the form of a metal contacting strip, which is provided with a plurality of notches and/or recesses to form a pattern of connecting parts which are provided for receiving semiconductor components or their connecting wires.

More and more switch over is taking place to semiconductor arrangements which comprise a plurality of semiconductor components. In addition to integrated semiconductor technology, in which numerous individual components are accommodated in a common semiconductor body, there is still the so-called multi-chip technology in which numerous individual components, which are accommodated in each case in a separate semiconductor body, are connected to each other. Either insulating plates coated with conductive paths or contacting strips of the type mentioned hereinabove are used to this end as the carrier body.

The greater the number of semiconductor components, the more difficult becomes their connection since the connecting wires must not cross each other if short-circuits are to be avoided.

SUMMARY OF THE INVENTION

It is an object of the invention to improve contacting facilities in such arrangements.

According to one aspect of the invention, there is provided a semiconductor arrangement comprising a metal contacting strip, which is provided with a plurality of notches and/or cutouts to form a pattern of connecting parts, which are provided for receiving the semiconductor components or their connecting wires, characterised in that insulating platelets, which are metallized on their free surface, are arranged on the contacting strips to bridge over relatively large gaps between contact points, which platelets on the one hand are connected by means of a connecting wire to a connecting point and, on the other hand, likewise by means of a connecting wire, are connected to a semiconductor component or to a further connecting point.

According to a second aspect of the invention there is provided a semiconductor arrangement comprising a metal contacting strip means for forming a pattern of connecting parts for receiving semiconductor components or their connecting wires, and a plurality of insulating platelets arranged on contacting strips of said contacting strip means, a metallizing layer on the free surfaces of said insulating platelets, and connecting wires connecting said metallizing layer on said insulating platelets to contact points or semiconductor components on said contacting strip means.

BRIEF DESCRIPTION OF THE DRAWINGS

The invention will now be described in greater detail, by way of example, with reference to the drawings, in which.

DESCRIPTION OF THE PREFERRED EMBODIMENT

Basically the invention proposes, in the case of a contacting strip of the type described hereinabove, that insulating platelets, metallized on the free surface side, are arranged on the contacting strips to bridge relatively large gaps between the contact points, which platelets on the one hand, are connected by means of a connecting wire to a connecting point and, on the other hand, likewise by means of a connecting wire, to a semiconductor component or to a further connecting point.

The platelets of insulating material form contact islands, with the help of which, on the one hand, the problem of relatively larger gaps existing between the contact points can be overcome, and on the other hand, a direct connection over corner points can be achieved which was previously impossible. Short connecting wires, by which short-circuits can be excluded as well as by which a higher packing density, an increased reliability of the circuit and many-sided switching possibilities are obtained with the help of the platelets.

The contact islands or insulating material platelets preferably comprise ceramics and are, for example, gold-plated on the free surface. The contact islands are stuck, for example on to the contacting strips.

Figure 1:
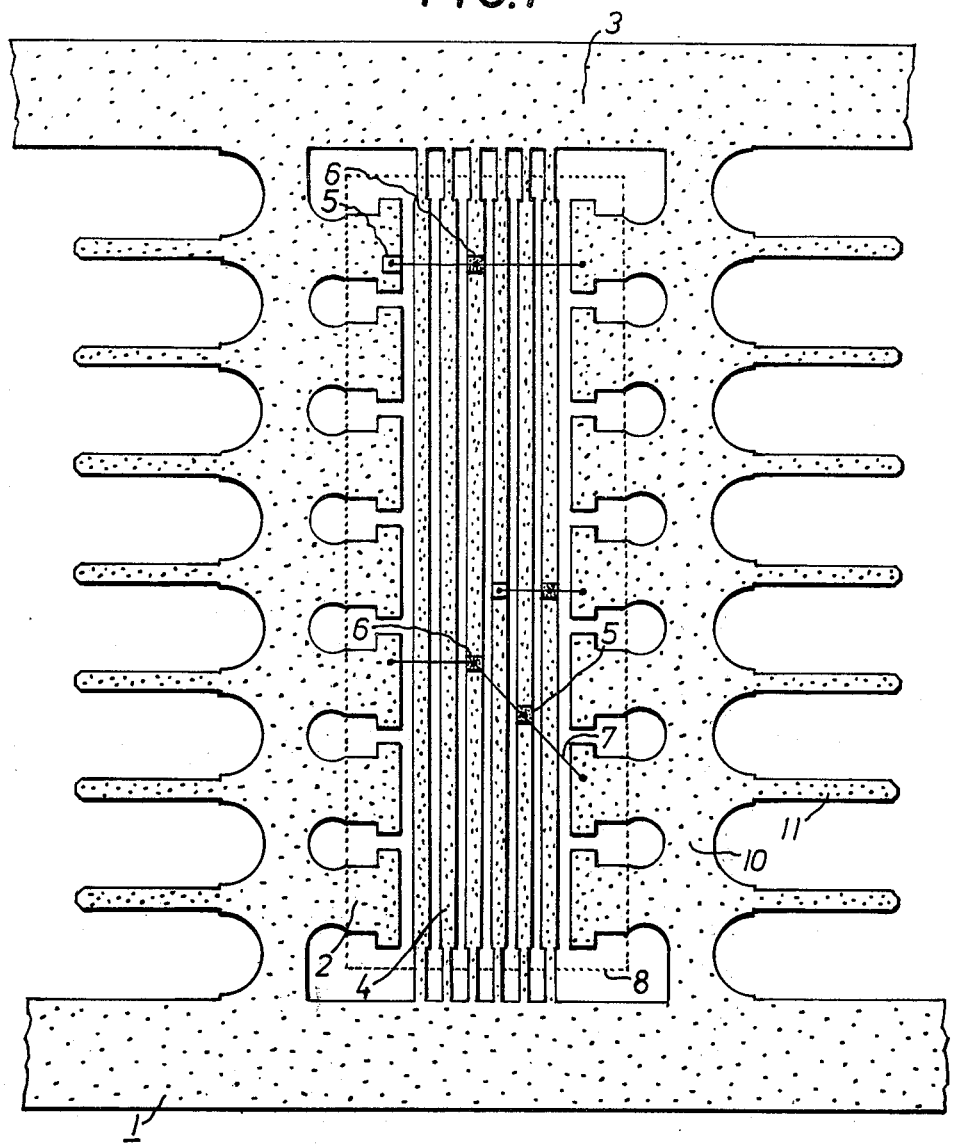
FIG. 1 is a plan view of one form of semiconductor arrangement in accordance with the invention.

Referring now to the drawings, FIG. 1 shows a unit 1 of a screen-shaped contacting strip, which is provided for receiving a circuit. The metal contacting strip comprises a rectangular lead frame, which is formed from longitudinal webs 10 and transverse webs 3. Connecting tongues 11, which later represent the contacts or external leads for a finished semiconductor housing project outwardly on both longitudinal sides of the frame. Contacting tongues 2, which can form the end points for the connecting wires or also receive semiconductor components 5, project into the frame interior, likewise on the two longitudinal sides of the frame. Metal strips 4, which run parallel to each other, which end at the transverse webs 3 of the frame and are arranged perpendicularly to the extension direction of the contacting tongues 2, extend between the two rows of tongues. These longitudinal strips preferably receive the semiconductor platelets 5 and insulating material platelets 6. A semiconductor component 5 must be connected to the opposite tongue by means of the strips 4 for reasons of circuit technology as is shown in the top part of FIG. 1. Such a connecting wire is too long so that the danger of a short-circuit with the strips 4 always exists. This danger is avoided, if the connecting wire is first led to an insulating material platelet 6 and only then led to the connecting tongue from there. The insulating material platelets 6 will then preferably divide the entire wire length into approximately two parts of the same size.

FIG. 1 shows, in the lower part, how a semiconductor component is connected on a strip 4 to two tongues lying opposite each other and staggered with respect to each other. The insulating material platelet 6 is so arranged that the shortest possible connections are accomplished, by which the other necessary connections are not disturbed.

The semiconductor arrangement is always cast in a housing 8, which is bounded by the line 8 drawn with a broken line. Thereafter, in addition, the side webs 3 and the regions between the individual tongues must be removed to insulate the different connecting parts.

Figure 2:
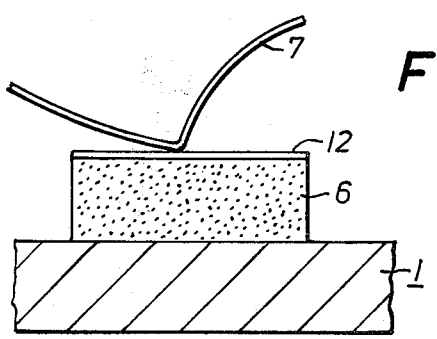
FIG. 2 is a sectional view of a platelet shown in FIG. 1.

FIG. 2 shows an individual insulating material platelet 6, which comprises a ceramic and is for example 0.2 mm thick. A metal layer 12, for example of gold, is arranged on the upper surface and has a thickness of approximately 5 µm. FIG. 2 further shows how the contacting wire 7 is connected to the gold surface 12 so that the ceramic platelets form a support point for the connecting wires. The gold layer can be evaporated thereonto or impressed thereon. Of course, also glass or Pertinax platelets can be used instead of ceramics.

Figure 3:
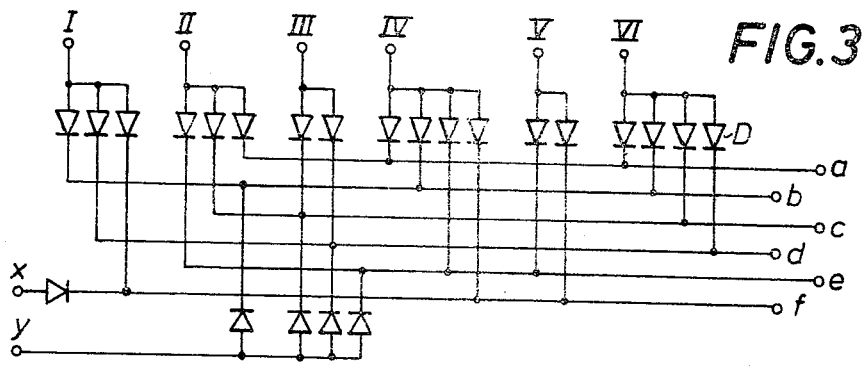
FIG. 3 is a circuit diagram of a multi-diode matrix.

FIG. 3 shows a diode/matrix arrangement which, for example, comprises 23 diodes. Such diode circuits are required for example to trigger or control storage cells.

Figure 4:
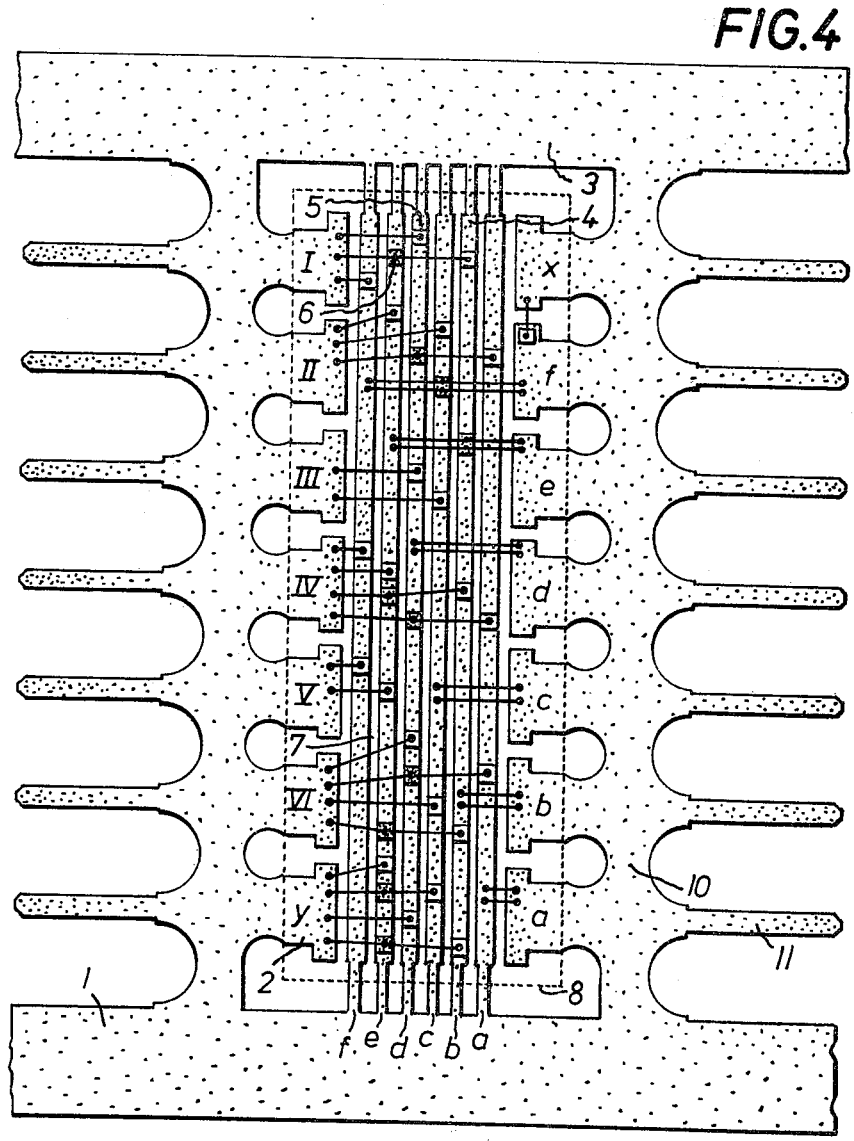
FIG. 4 is a view similar to FIG. 1 but showing the arrangement connected for a multi-diode matrix.

The realization of such a circuit in multi-chip technology with the help of the insulating contacting islands can be seen from FIG. 4, wherein the reference numerals used in FIG. 1 are used again for all the components.

It can be seen from FIG. 4 how the connecting wires can be kept very short with the help of insulating material platelets and in so doing short-circuits can be avoided.

It will be understood that the above description of the present invention is suceptible to various modification changes and adaptations.

What is claimed is:

1. In a semiconductor circuit arrangement including a metal contacting strip which is provided with a plurality of notches and/or recesses which divide said strip into a pattern of spaced connecting parts, including the external leads for the circuit arrangement, for receiving the semiconductor components or their connecting wires, a plurality of semiconductor components mounted on selected ones of said connecting parts, a plurality of connecting wires interconnecting the contact points of said semiconductor components with the contact points of selected ones of said connecting parts to form a desired circuit arrangement, and a housing which encloses said semiconductor wafers, said connecting wires and the portions of said contact strip other than said external leads; the improvement comprising means for providing a bridging connection between two contact points which are spaced relatively far apart whereby relatively short lengths of connecting wire may be utilized, said means including an insulating platelet mounted on and having one surface thereof connected to one of said connecting parts which is situated between said two contact points, a metal coating on the surface of said platelet opposite said one surface, and a pair of connecting wires, each electrically connected between said metal coating and a respective one of said two contact points.

2. A semiconductor circuit arrangement as defined in claim 1, wherein said platelets comprise ceramic platelets and said metal coating is gold.

3. A semiconductor circuit arrangement as defined in claim 1 wherein said metal contacting strip has a rectangular shape and wherein said connecting parts include a plurality of spaced tongues extending in two rows along two opposite sides of said contacting strip and forming the external leads for said arrangement, and a plurality of spaced strips running perpendicularly to said tongues and parallel to each other between the rows of tongues for receiving said semiconductor components and said insulating platelets.

4. A semiconductor circuit arrangement as defined in claim 3 wherein said semiconductor components are a plurality of diodes and said circuit arrangement is a diode matrix.

5. In a semiconductor arrangement including a planar metal contacting strip which is divided into a pattern of spaced conductors, including the external leads for the circuit arrangement, for receiving semiconductor components or their connecting wires, a plurality of semiconductor components mounted on selected ones of said conductors, a plurality of wires interconnecting selected ones of the contact points of said semiconductor components with selected ones of the contact points of said conductors to form a desired circuit arrangement, and a housing enclosing said semiconductor components, said connecting wires and the portions of said contacting strip other than said external leads; the improvement wherein: an insulating platelet is mounted on and has one surface connected to one of said conductors which is situated between two contact points which are to be connected by a wire and which are spaced far apart and separated from each other by a plurality of said conductors which are not to be connected to said two contact points; a metal coating is provided on the surface of said platelet opposite said one surface; and the wire connecting said two contact points includes a pair of connecting wires which are each electrically connected between said metal coating and a respective one of said two contact points and bridged over any of said plurality of conductors situated between said platelet and the associated one of said two contact points, whereby only relatively short lengths of wire are required.

6. A circuit arrangement as defined in claim 5 wherein said contacting strip has a rectangular shape and said conductors include: a first plurality of spaced leads extending in two rows along two opposite sides of said contacting strip and forming the external leads for said arrangement; and a second plurality of spaced parallel strip-like leads extending perpendicular to said first plurality of leads and between said two rows.

7. A circuit arrangement as defined in claim 6 wherein said semiconductor components are diodes each having one terminal electrically connected to the one of said conductors on which it is mounted; and said circuit arrangement is a diode matrix.

* * * * *